United States Patent
Chen

(10) Patent No.: US 6,274,281 B1
(45) Date of Patent: Aug. 14, 2001

(54) USING DIFFERENT TRANSMITTANCE WITH ATTENUATE PHASE SHIFT MASK (APSM) TO COMPENSATE ADI CRITICAL DIMENSION PROXIMITY

(75) Inventor: Jeng-Horng Chen, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/473,027

(22) Filed: Dec. 28, 1999

(51) Int. Cl.⁷ .................................................. G03F 9/00
(52) U.S. Cl. .................................. 430/5; 430/394
(58) Field of Search ................... 430/5, 322, 323, 430/324, 394

(56) References Cited

U.S. PATENT DOCUMENTS

| | | | |
|---|---|---|---|
| 5,618,643 | 4/1997 | Dao et al. | 430/5 |
| 5,766,806 | 6/1998 | Spence | 430/5 |
| 5,783,337 | 7/1998 | Tzu et al. | 430/5 |
| 5,786,114 | 7/1998 | Hashimoto | 430/5 |
| 5,869,212 | 2/1999 | Hashimoto | 430/5 |
| 6,183,915 | * 2/2001 | Rolfson | 430/5 |
| 6,190,809 | * 2/2001 | Tzu et al. | 430/5 |

* cited by examiner

Primary Examiner—S. Rosasco
(74) Attorney, Agent, or Firm—George O. Saile; Stephen B. Ackerman; Larry J. Prescott

(57) ABSTRACT

An attenuating phase shifting mask and method of forming an attenuating mask for patterns having both isolated and dense contact holes and/or line/space patterns on the same mask. In the more isolated regions of the contact hole mask the contact holes have 0° phase shift and 100% light transmission. In the dense regions of a contact hole mask the contact holes have 0° phase shift and a second thickness of light absorbing material with a relatively low light absorption. The region around the contact holes have 180° phase shift and a first thickness of light absorbing material with a relatively high light absorption. The lines of a line/space mask have 180° phase shift and a first thickness of light absorbing material with a relatively high light absorption. The spaces between the isolated lines have 0° phase shift and 100% light transmission. The spaces between the dense lines 0° phase shift and a second thickness of light absorbing material with a relatively low light absorption. The dense and isolated pattern regions are separated using logic operations on the mask design data.

18 Claims, 5 Drawing Sheets

USING DIFFERENT TRANSMITTANCE WITH ATTENUATE PHASE SHIFT MASK (APSM) TO COMPENSATE ADI CRITICAL DIMENSION PROXIMITY

BACKGROUND OF THE INVENTION

(1) Field of the Invention

This invention relates to the use of different transmittance light absorbing material for different duty ratio contact hole patterns and line/space patterns in attenuating phase shifting masks.

(2) Description of the Related Art

Attenuating phase shifting masks are often used to form patterns on integrated circuit wafers. As pattern dimensions become very small critical dimension proximity effect can become a significant problem and methods to correct for the proximity effect problems must be used.

U.S. Pat. No. 5,869,212 to Hashimoto describes an attenuating phase shifting mask using regions of increased light transmissivity adjacent to the defined circuit features.

U.S. Pat. No. 5,786,114 to Hashimoto describes an attenuating phase shifting mask where boundary regions are formed form the same halftone layer used to form circuit regions. The halftone layer in the boundary regions are not subjected to the stabilization step and thus have lower transmittance than the stabilized halftone layer. This lower transmittance halftone material in the boundary regions helps avoid light leakage to adjacent chip areas.

U.S. Pat. No. 5,766,806 to Spence describes a phase shift mask using different phase shift amounts in different regions of the pattern.

U.S. Pat. No. 5,783,337 to Tzu et al. describes an attenuating phase shifting mask using an opaque border.

U.S. Pat. No. 5,618,643 to Dao et al. describes an embedded phase shifting mask with a roughened surface to change the transmission.

SUMMARY OF THE INVENTION

Attenuating phase shifting masks are often used to form patterns on integrated circuit wafers. As pattern dimensions become very small optical proximity effects can become a significant problem in critical dimension regions of a mask pattern. Correction methods such as Optical Proximity Correction are often used to correct for these types of problems, but these methods can be complicated and consume a large amount of computer design resource. In masks having both dense and more isolated line/space patterns and contact hole patterns the problems of pattern correction become even more complicated.

It is a principal objective of this invention to provide a mask which can be used for both dense and more isolated line/space or contact hole patterns without using correction methods such as Optical Proximity Correction.

It is another principal objective of this invention to provide a method of forming a mask which can be used for both dense and more isolated line/space or contact hole patterns without using correction methods such as Optical Proximity Correction.

These objectives are achieved by using attenuating phase shifting masks with different light transmission in different regions of the mask. In the more isolated regions of a contact hole mask the contact holes have 0° phase shift and 100% light transmission while the region around the contact holes have 180° phase shift and relatively high light absorption. In the dense regions of a contact hole mask the contact holes have 0° phase shift and relatively low light absorption while the region around the contact holes have 180° phase shift and relatively high light absorption. In the more isolated regions of a line/space mask the lines have a 180° phase shift and relatively high light absorption while the spaces between the lines have 0° phase shift and 100% light transmission. In the dense regions of a line/space mask the lines have a 180° phase shift and relatively high light absorption while the spaces between the lines have 0° phase shift and relatively low light absorption.

The masks are formed by using a mask blank having a transparent mask substrate, a layer of light absorbing material formed on the transparent mask substrate, and a layer of transparent phase shifting material formed on the layer of light absorbing material. A layer of resist is formed on the layer of phase shifting material and exposed using variable exposure doses with a method such as an electron beam. In the contact hole mask a first exposure dose is used for the isolated contact holes and a second exposure dose, smaller than the first exposure dose, is used for the dense contact holes. In the line/space mask a first exposure dose is used for the spaces between the isolated lines a second exposure dose, smaller than the first exposure dose, is used for spaces between the dense lines.

The layer of resist is then developed to form a resist mask having no resist material in the isolated contact holes and spaces between isolated lines, a reduced thickness of resist material in the dense contact holes and spaces between the dense lines, and the full resist thickness in other regions of the mask. Dry anisotropic etching is then used to remove all of the phase shifting material and all of the light absorbing material from the isolated contact holes and the spaces between the isolated lines. The dry anisotropic etching also removes all of the phase shifting material and part of the light absorbing material from the isolated contact holes and the spaces between the isolated lines. The mask has a residue of resist material which is then removed to complete the mask. The dense and isolated parts of the mask are separated by performing logic operations on a pattern data file.

DESCRIPTION OF THE PREFERRED EMBODIMENTS

Figure 1A:
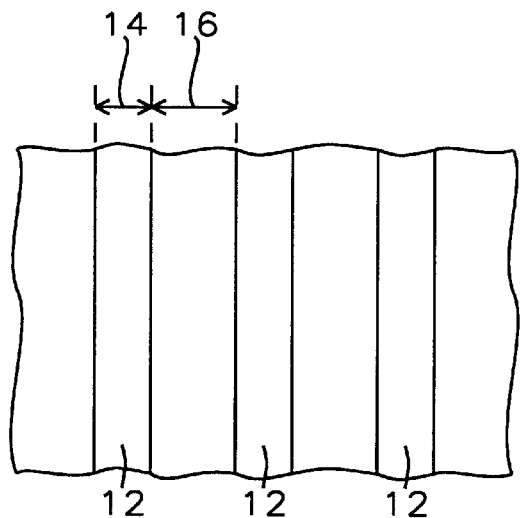
FIG. 1A shows a top view of a line/space pattern having both dense and isolated line/space regions.

FIG. 1A shows a top view of a line/space pattern having lines 12 with a width 14 and a space 16 between adjacent lines. If the space 16 between adjacent lines divided by the width 14 of the lines 12, the duty ratio, is less than a first critical duty ratio the lines are considered to be a dense line/space pattern in the description of the following embodiments. If the space 16 between adjacent lines divided by the width 14 of the lines 12, the duty ratio, is greater than or equal to the first critical duty ratio the lines are considered to be an isolated line/space pattern in the description of the following embodiments. The first critical duty ratio depends on the critical dimension and in this example is 2.5.

Figure 1B:
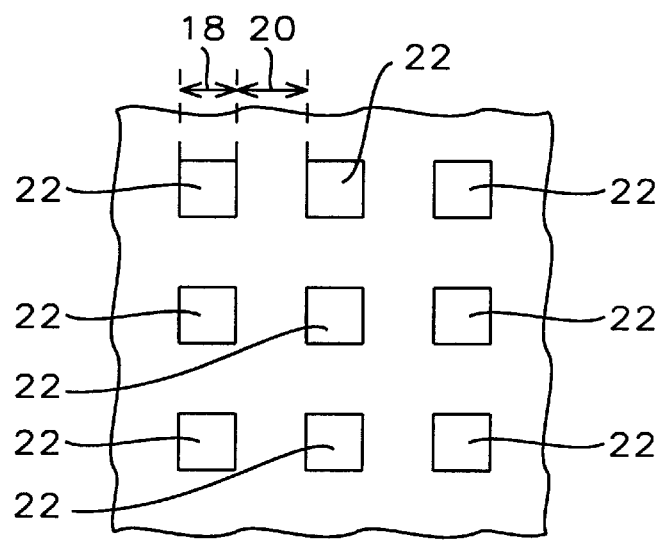
FIG. 1B shows a top view of a contact hole pattern having both dense and isolated contact hole regions.

FIG. 1B shows a top view of a contact hole pattern having contact holes 22 with a width 18 and a space 20 between the outer perimeter of adjacent holes. If the space 20 between the outer perimeter of adjacent holes divided by the width 18 of the holes 22, the duty ratio, is less than a second critical duty ratio the holes are considered to be a dense contact hole pattern in the description of the following embodiments. If the space 20 between the outer perimeter of adjacent holes divided by the width 18 of the holes 22, the duty ratio, is greater than or equal to the second critical duty ratio the holes are considered to be an isolated contact hole pattern in the description of the following embodiments. The second critical duty ratio depends on the critical dimension and in this example is 2.0.

Figure 2A:
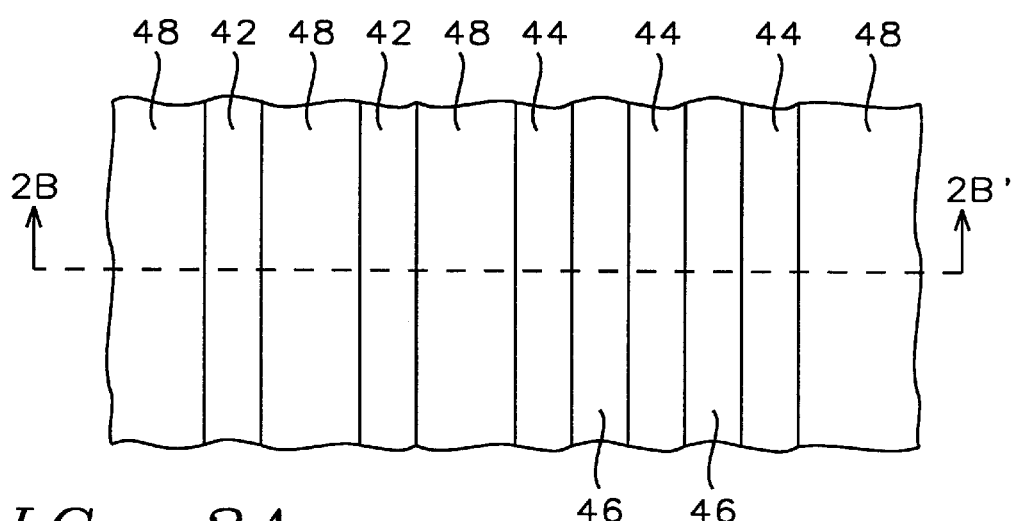
FIGS. 2A and 2B show top and cross section views of the mask of this invention for a line/space pattern having both dense and isolated line/space regions.
Figure 2B:
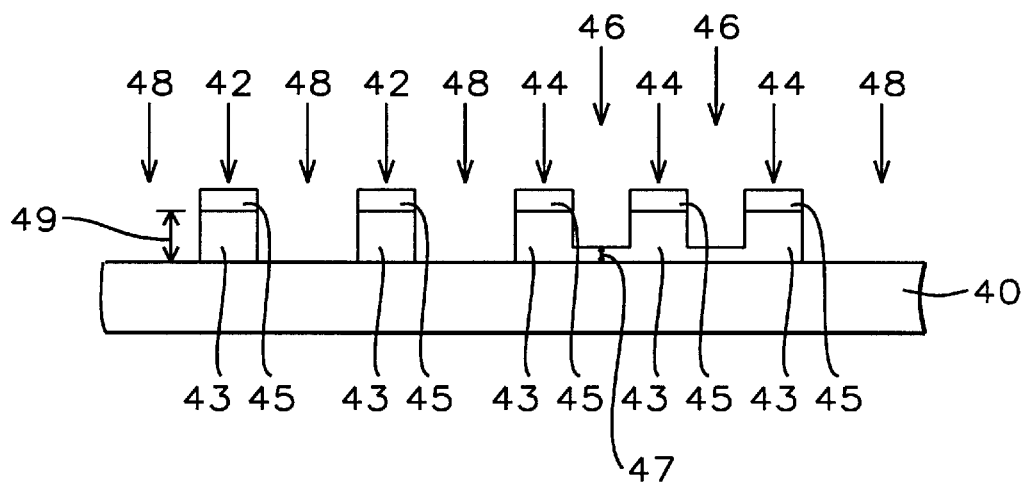

An embodiment of the mask of this invention for a line/space pattern is shown in FIGS. 2A and 2B. FIG. 2A shows a top view and FIG. 2B a cross section view, taken along line 2B–2B' of FIG. 2A, of a mask of this invention having both dense line/space regions and isolated line space/ regions. The lines 42 in the isolated part of the mask have a duty ratio greater than or equal to 2.5. The lines 44 in the dense part of the mask have a duty ratio of less than 2.5.

As shown in FIG. 2B the isolated lines 42 of the mask are formed of patterned light absorbing material 43, having a first thickness 49 and a first transmittance, formed on a transparent mask substrate 40 and patterned transparent phase shifting material 45 formed on the light absorbing material. The wider spaces 48 between the isolated lines 42, and outside the region of the dense lines 44, have neither light absorbing material nor phase shifting material formed on the transparent mask substrate. The phase shifting material 45 over the isolated lines 42 provide a phase shift of 180°.

As shown in FIG. 2B the dense lines 44 of the mask are formed of patterned light absorbing material 43, having the first thickness 49 and first transmittance, formed on a transparent mask substrate 40 and patterned transparent phase shifting material 45 formed on the light absorbing material. The more narrow spaces 46 between the isolated lines have a second thickness 47 of light absorbing material, having a second transmittance, with no phase shifting material formed on second thickness 47 of light absorbing material 43. The phase shifting material 45 over the dense lines 44 provides a phase shift of 180°.

In this example the first transmittance is between about 4% and 20% and the second transmittance is between about 90% and 99%. The light absorbing material, having the second thickness 47 and second transmittance, between the dense lines 44 of the line/space pattern provides improved image quality for the attenuating phase shifting mask and avoids the necessity of using methods such as optical proximity correction.

Figure 3A:
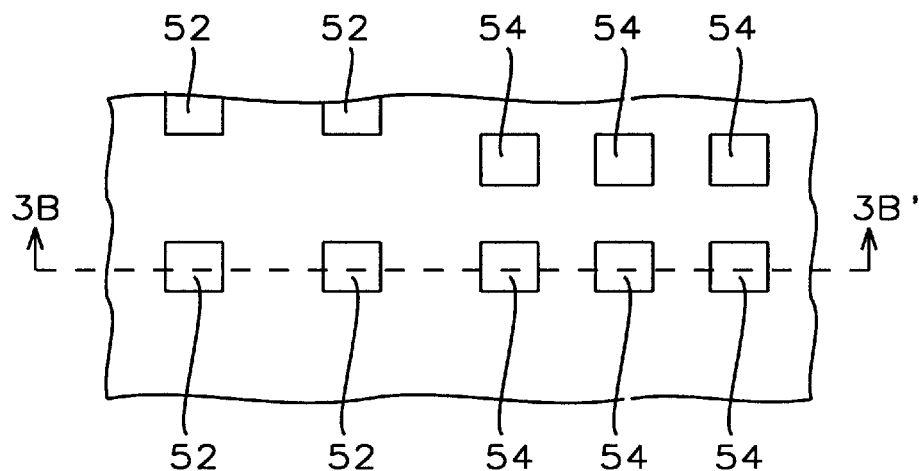
FIGS. 3A and 3B show top and cross section views of the mask of this invention for a contact hole pattern having both dense and isolated contact hole regions.
Figure 3B:
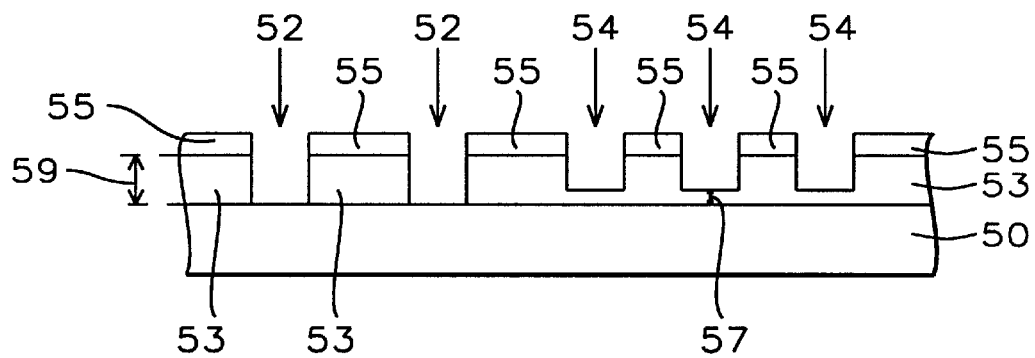

An embodiment of the mask of this invention for a contact hole pattern is shown in FIGS. 3A and 3B. FIG. 3A shows a top view and FIG. 3B a cross section view, taken along line 3B–3B' of FIG. 3A, of a mask of this invention having both dense contact hole regions and isolated contact hole regions. The contact holes 52 in the isolated part of the mask have a duty ratio greater than or equal to 2.0. The contact holes 54 in the dense part of the mask have a duty ratio of less than 2.0.

As shown in FIG. 3B the isolated contact holes 52 of the mask are formed by removing all of the light absorbing material and phase shifting material from the contact hole 52 leaving a first thickness 59 of light absorbing material 53, having a first transmittance, and a layer of phase shifting material 55, around the isolated contact holes. The dense contact holes 54 of the mask are formed by removing all of the phase shifting material and part of the light absorbing material from the dense contact holes 54 leaving the first thickness 59 of light absorbing material 53, having the first transmittance, and a layer of phase shifting material 55 around the dense contact holes, and a second thickness 57, less than the first thickness 59 and having a second transmittance, of the light absorbing material 53 in the dense contact holes 54. The phase shifting material 55 provides a phase shift of 180°.

In this example the first transmittance is between about 4% and 20% and the second transmittance is between about 90% and 99%. The light absorbing material, having the second thickness 57 and second transmittance, in the dense contact holes 54 of the contact hole pattern provides improved image quality for the attenuating phase shifting mask and avoids the necessity of using methods such as optical proximity correction.

Figure 8:
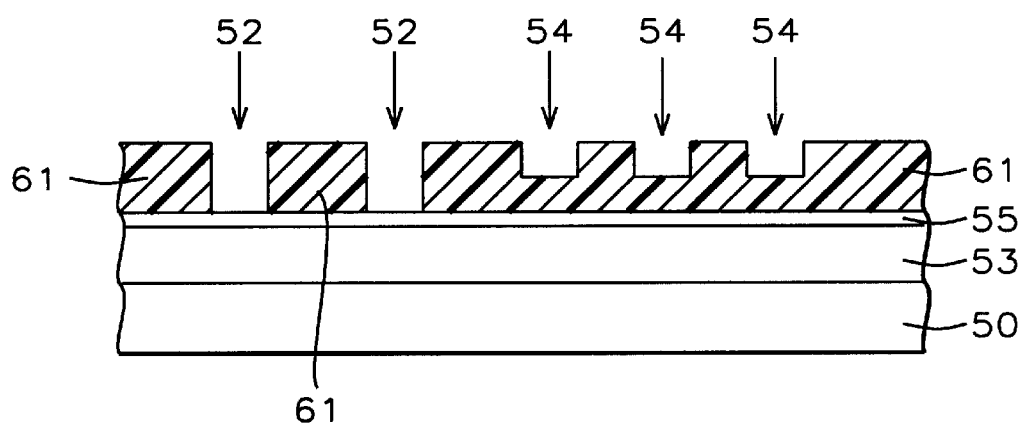
Figure 9:
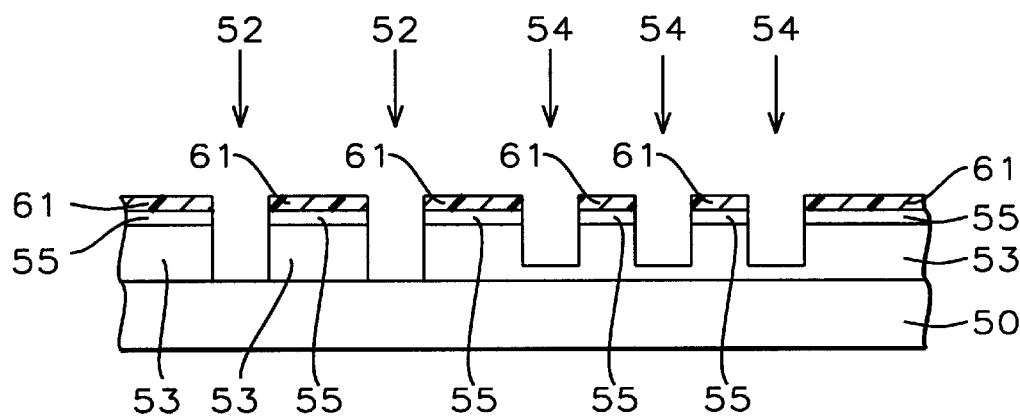
Figure 10:
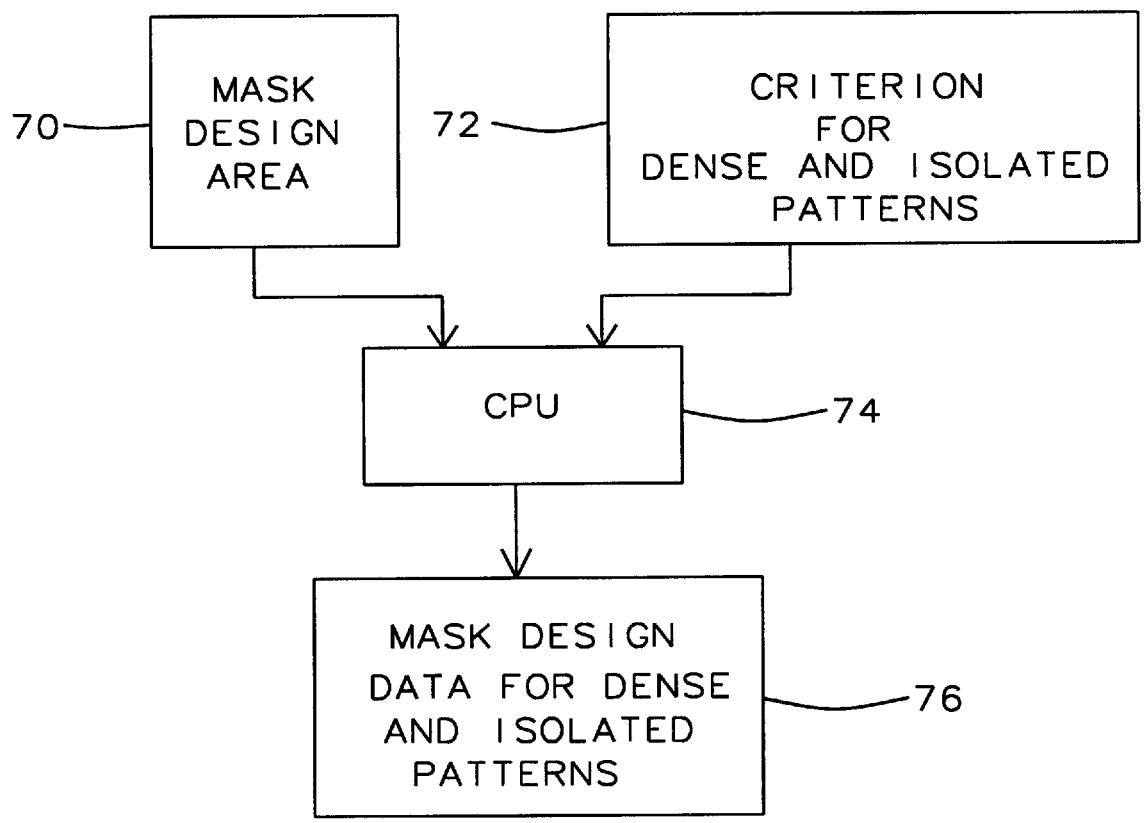
FIG. 10 shows a block diagram of the method for separating the dense and isolated regions of the mask.

Refer now to FIGS. 4–10 for embodiments of methods of forming the attenuating phase shifting masks of this invention. FIG. 10 shows a block diagram of the method of separating the mask pattern into the dense and isolated regions. The mask design data 70 and the criterion for dense and isolated patterns 70 are fed to a computer processing unit 74. In the computer processing unit logic operations are used to separate the mask design data into mask design data for dense and isolated patterns 76.

Figure 4:
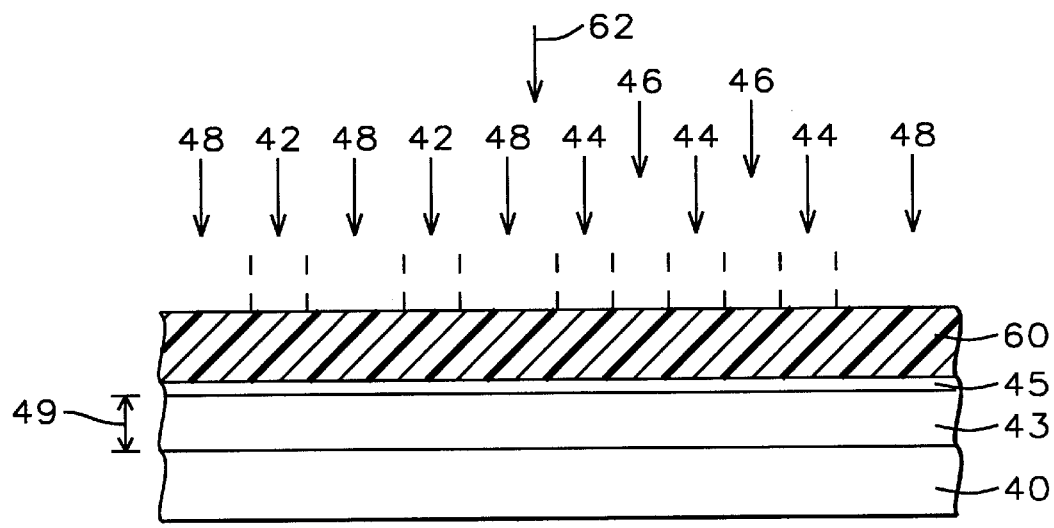
FIGS. 4–6 show cross section view showing the process steps for forming the line/space mask of this invention.
Figure 5:
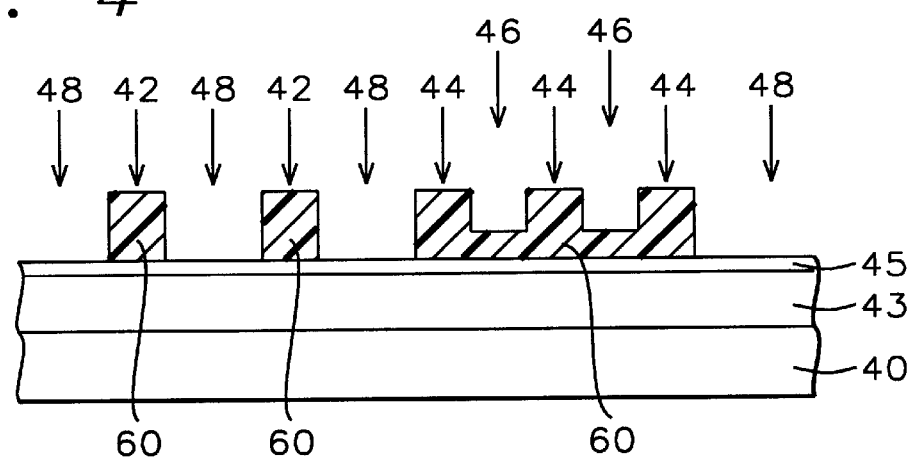
Figure 6:
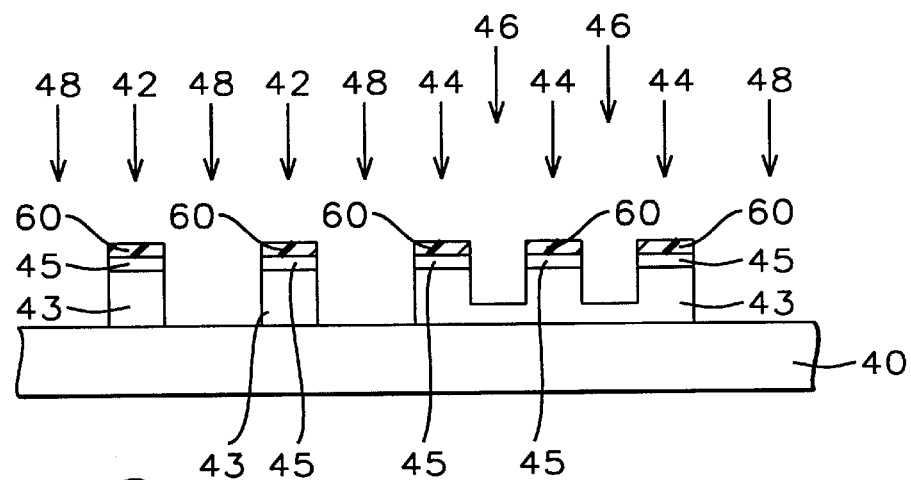

An embodiment of a method of forming the line/space mask of this invention is shown in FIGS. 4–6. FIG. 4 shows a cross section of a mask blank comprising a transparent mask substrate 40, a layer of light absorbing material 43 formed on the transparent mask substrate 40, and a layer of phase shifting material 45 formed on the layer of light absorbing material 43. The layer of light absorbing material has a first thickness 49 and has a first transmittance. The layer of phase shifting material 45 provides a phase shift of 180°. A layer of resist material 60 is formed on the layer of phase shifting material 45. The layer of resist 60 is exposed using a method such as an electron beam 62. The regions of the resist 60 corresponding to the spaces 48 between the isolated lines 42 and outside the region of the dense lines 44 are exposed using a first exposure dose. The regions of the resist 60 corresponding to the spaces 46 between the dense lines 44 are exposed using a second exposure dose, which is less than the first exposure dose. The regions of the resist 60 corresponding to the isolated lines 42 and dense lines 44 are not exposed.

As shown in FIG. 5 the layer of resist 60 is then developed removing all the resist from the spaces 48 between the isolated lines 42 and outside the region of the dense lines 44 and part of the resist from the spaces 46 between the dense lines 44, thereby forming a resist mask. As shown in FIG. 6 dry anisotropic etching is used with the resist mask to remove all of the phase shifting material and all of the light absorbing material from the spaces 48 between the isolated lines 42 and outside the region of the dense lines 44, and all of the phase shifting material and part of the light absorbing material in the spaces 46 between the dense lines 44. The dry anisotropic etching also etches the resist material. As shown in FIG. 6 some of the resist mask remains on the isolated lines 42 and the dense lines 44. The remaining resist is then stripped leaving the completed mask as shown in FIG. 2B. The completed mask leaves phase shifting material 45 and a first thickness 49 of light absorbing material 43, having a first transmittance, at the isolated lines 42 and the dense lines 44. The completed mask also leaves a second thickness 47 of light absorbing material 43, having a second transmittance, in the spaces 46 between the dense lines 44.

In this example the first transmittance is between about 4% and 20% and the second transmittance is between about 90% and 99%. The light absorbing material 43, having the second thickness 47 and second transmittance, between the dense lines 44 of the line/space pattern provides improved image quality for the attenuating phase shifting mask and avoids the necessity of using methods such as optical proximity correction.

Figure 7:
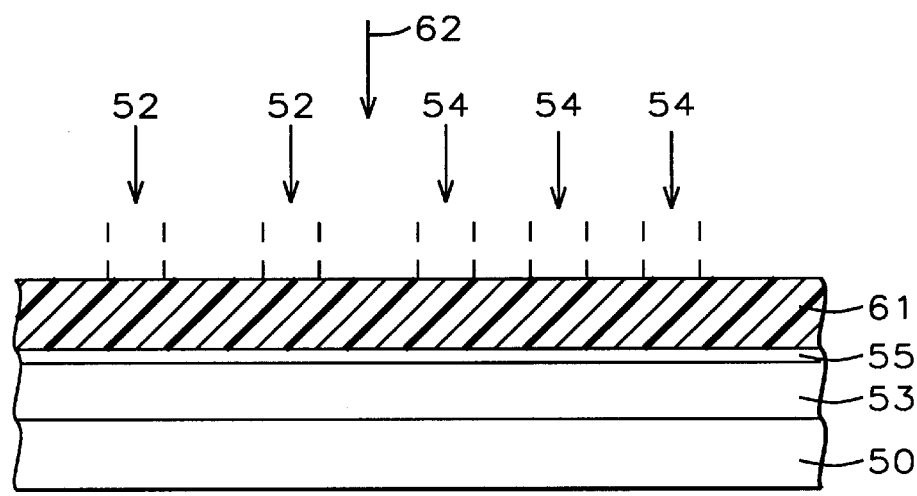
FIGS. 7–9 show a cross section view showing the process steps for forming the contact hole mask of this invention.

An embodiment of a method of forming the contact hole mask of this invention is shown in FIGS. 7–9. FIG. 7 shows a cross section of a mask blank comprising a transparent mask substrate 50, a layer of light absorbing material 53 formed on the transparent mask substrate 50, and a layer of phase shifting material 55 formed on the layer of light absorbing material 53. The layer of light absorbing material has a first thickness 59 and has a first transmittance. The layer of phase shifting material 55 provides a phase shift of 180°. A layer of resist material 61 is formed on the layer of phase shifting material 55. The layer of resist 61 is exposed using a method such as an electron beam 62. The regions of the resist 61 corresponding to the isolated contact holes 52 are exposed using a first exposure dose. The regions of the resist 61 corresponding to the dense contact holes 54 are exposed using a second exposure dose, which is less than the first exposure dose. The remainder of the layer of resist 61 is not exposed.

As shown in FIG. 8 the layer of resist 61 is then developed removing all the resist from the isolated contact holes 52 and part of the resist from the dense contact holes 54, thereby forming a resist mask. As shown in FIG. 9 dry anisotropic etching is used with the resist mask to remove all of the phase shifting material and all of the light absorbing material from the isolated contact holes 52, and all of the phase shifting material and part of the light absorbing material from the dense contact holes 54. The dry anisotropic etching also etches the resist material. As shown in FIG. 9 some of the resist mask remains outside of the contact holes. The remaining resist is then stripped leaving the completed mask as shown in FIG. 3B. The completed mask leaves phase shifting material 55 and a first thickness 59 of light absorbing material 53, having a first transmittance in the region of the mask outside the isolated contact holes 52 and the dense contact holes 54. The completed mask also leaves a second thickness 57 of light absorbing material 53, having a second transmittance, in the dense contact holes 54.

In this example the first transmittance is between about 4% and 20% and the second transmittance is between about 90% and 99%. The light absorbing material 53, having the second thickness 57 and second transmittance, in the dense contact holes 54 provides improved image quality for the attenuating phase shifting mask and avoids the necessity of using methods such as optical proximity correction.

Although all of the preceding embodiments show the contact hole attenuating phase shifting masks and line/space attenuating phase shifting masks as separate masks those skilled in the art will readily recognize that isolated contact holes, dense contact holes, isolated line/space patterns, dense line/space patterns, or any combination of these could be combined on a single mask.

While the invention has been particularly shown and described with reference to the preferred embodiments thereof, it will be understood by those skilled in the art that various changes in form and details may be made without departing from the spirit and scope of the invention.

What is claimed is:

1. A contact hole mask, comprising:
    a transparent mask substrate having a first number of first contact hole regions and a second number of second contact hole regions wherein each of said first contact hole regions have a first width and a first outer perimeter and each of said second contact hole regions have a second width and a second outer perimeter;
    a first thickness of light absorbing material formed on that part of said transparent mask substrate not covered by said first number of first contact hole regions and said second number of second contact hole regions, wherein said first thickness of said light absorbing material has a first transmittance;
    a second thickness of said light absorbing material formed on each of said first contact hole regions of said transparent mask substrate, wherein said second thickness of said light absorbing material has a second transmittance; and
    a third thickness of transparent phase shifting material formed on said first thickness of said light absorbing material covering that part of said transparent mask substrate not covered by said first number of first contact hole regions and said second number of second contact hole regions, wherein said third thickness of said transparent phase shifting material produces a phase shift of 180°.

2. The contact hole mask of claim 1 wherein the distance between said outer perimeter of adjacent said first contact hole regions divided by said first width is less than 2.0 and the distance between the outer perimeter of adjacent said second contact hole regions divided by said second width is greater than or equal to 2.0.

3. The contact hole mask of claim 1 wherein said first transmittance is between about 4% and 20%.

4. The contact hole mask of claim 1 wherein said second transmittance is between about 90% and 99%.

5. A line/space mask, comprising:
    a transparent mask substrate;
    a first number of first lines having a first width formed of a first thickness of light absorbing material on said transparent mask substrate, wherein said first thickness of said light absorbing material has a first transmittance;
    a second number of second lines having a second width formed of said first thickness of said light absorbing material on said transparent mask substrate;
    a second thickness of said light absorbing material formed on said transparent mask substrate between adjacent said first lines, wherein said second thickness of said light absorbing material has a second transmittance; and
    a third thickness of transparent phase shifting material formed on said first lines formed of said first thickness of said light absorbing material and said second lines formed of said first thickness of said light absorbing material, wherein said third thickness of said transparent phase shifting material produces a phase shift of 180°.

6. The line/space mask of claim 5 wherein the distance between adjacent said first lines divided by said first width is less than 2.5 and the distance between adjacent said second lines divided by said second width is greater than or equal to 2.5.

7. The line/space mask of claim 5 wherein said first transmittance is between about 4% and 20%.

8. The line/space mask of claim 5 wherein said second transmittance is between about 90% and 99%.

9. A method of forming a contact hole mask, comprising:

providing a transparent mask substrate having a first number of first contact hole regions and a second number of second contact hole regions wherein each of said first contact hole regions have a first width and a first outer perimeter and each of said second contact hole regions have a second width and a second outer perimeter;

forming a layer of light absorbing material having a first thickness on said transparent mask substrate, wherein said first thickness of said light absorbing material has a first transmittance;

forming a layer of phase shifting material on said layer of light absorbing material, wherein said layer of phase shifting material provides a phase shift of 180°;

forming a layer of resist material on said layer of phase shifting material;

exposing that part of said layer of resist material directly over said first contact hole regions with a first exposure dose and that part of said layer of resist directly over said second contact hole regions with a second exposure dose, wherein said second exposure dose is greater than said first exposure dose;

developing said layer of resist thereby forming a resist mask;

etching away that part of said layer of phase shifting material directly over said first contact hole regions, that part of said layer of phase shifting material directly over said second contact hole regions, a first depth of that part of said layer of light absorbing material directly over said first contact hole regions, and that part of said layer of light absorbing material directly over said second contact hole regions using dry anisotropic etching and said resist mask, wherein said first depth is less than said first thickness and a second thickness is equal to said first depth subtracted from said first thickness; and removing the remaining said resist mask.

10. The method of claim 9 wherein the distance between said outer perimeter of adjacent said first contact hole regions divided by said first width is less than 2.0 and the distance between the outer perimeter of adjacent said second contact hole regions divided by said second width is greater than or equal to 2.0.

11. The method of claim 9 wherein said first contact hole regions and said second contact hole regions are determined by performing logic operations on a pattern data file.

12. The method of claim 9 wherein said first transmittance is between about 4% and 20%.

13. The method of claim 9 wherein said second transmittance is between about 90% and 99%.

14. A method of forming a line/space mask, comprising:

providing a transparent mask substrate having a first number of first line regions each having a first width and a second number of second line regions each having a second width;

forming a layer of light absorbing material having a first thickness on said transparent mask substrate, wherein said first thickness of said light absorbing material has a first transmittance;

forming a layer of phase shifting material on said layer of light absorbing material, wherein said layer of phase shifting material provides a phase shift of 180°;

forming a layer of resist material on said layer of phase shifting material;

exposing that part of said layer of resist material between adjacent said first line regions with a first exposure dose and the remaining part of said layer of resist which is not over said first line regions or said second line regions with a second exposure dose, wherein said second exposure dose is greater than said first exposure dose;

developing said layer of resist thereby forming a resist mask;

etching away that part of said layer of phase shifting material which is not over said first line regions or said second line regions, a first depth of that part of said layer of light absorbing material between adjacent said first line regions, and the remaining part of said layer of light absorbing material which is not directly over said first line regions or said second line regions using dry anisotropic etching and said resist mask, wherein said first depth is less than said first thickness and a second thickness is equal to said first depth subtracted from said first thickness; and removing the remaining said resist mask.

15. The method of claim 14 wherein the distance between adjacent said first line regions divided by said first width is less than 2.5 and the distance between adjacent said second line regions divided by said second width is greater than or equal to 2.5.

16. The method of claim 14 wherein said first line regions and said second line regions are determined by performing logic operations on a pattern data file.

17. The method of claim 14 wherein said first transmittance is between about 4% and 20%.

18. The method of claim 14 wherein said second transmittance is between about 90% and 99%.

* * * * *